United States Patent [19]

Hobelsberger

[11] Patent Number: 5,162,669
[45] Date of Patent: Nov. 10, 1992

[54] SEMICONDUCTOR SWITCH INCLUDING A DEVICE FOR MEASURING A DEPLETION LAYER TEMPERATURE OF THE SWITCH

[75] Inventor: Max Hobelsberger, Wurenlingen, Switzerland

[73] Assignee: Asea Brown Boveri Ltd., Switzerland

[21] Appl. No.: 588,018

[22] Filed: Sep. 25, 1990

[30] Foreign Application Priority Data

Sep. 25, 1989 [CH] Switzerland ............ 3460/89

[51] Int. Cl.⁵ .............. H03K 3/353; H03K 3/26; H03K 17/60
[52] U.S. Cl. .................. 307/304; 307/310; 307/570; 307/572; 361/103
[58] Field of Search ............. 361/103; 307/572, 573, 307/304, 443, 310, 570

[56] References Cited

U.S. PATENT DOCUMENTS

| | | | |
|---|---|---|---|
| 4,052,744 | 10/1977 | Boothman et al. | 361/103 |
| 4,727,450 | 2/1988 | Fachinetti et al. | 361/103 |

FOREIGN PATENT DOCUMENTS

| | | |
|---|---|---|
| 0135870 | 4/1985 | European Pat. Off. |
| 0319870 | 6/1989 | European Pat. Off. |
| 1108317 | 6/1961 | Fed. Rep. of Germany |
| 1170061 | 5/1964 | Fed. Rep. of Germany |
| 2140290 | 2/1973 | Fed. Rep. of Germany |
| 2528767 | 5/1976 | Fed. Rep. of Germany |
| 2293746 | 7/1976 | France |
| 2581807 | 11/1986 | France |

OTHER PUBLICATIONS

M. Reffay "UAF 1780—Low-loss Monolithic Switch Component", Dec. 1988.

*Primary Examiner*—Timothy P. Callahan
*Attorney, Agent, or Firm*—Ostrolenk, Faber, Gerb & Soffen

[57] ABSTRACT

A semiconductor switch includes a device for measuring the depletion-layer temperature of a semiconductor rectifier (V) which conducts load current. This device consists of a network (N) which electrically simulates the thermal behavior of the semiconductor rectifier (V), a converter element (W) provided between semiconductor rectifier (V) and the network (N) for producing a current ($i_v$) which is proportional to the power dissipation in the semiconductor rectifier (V), and a comparator (A) which is controlled by the output of the network (N) and acts on the semiconductor rectifier (V). The semiconductor rectifier has a simple construction, is secured against short circuits and overloads and at the same time is also capable of easily controlling capacitive loads. This is achieved so that, on the one hand, the converter element (W) is configured as an ohmic resistor ($R_w$) and is connected together with a first switch element ($S_1$) and a capacitor ($C_1$) of the network (N) in parallel to the semiconductor rectifier (V). On the other hand, two voltage source ($U_{off}$, $U_{on}$) are provided which are controlled via further switches (S0 and S2) by the comparator (A) which acts on the semiconductor rectifier (V).

3 Claims, 1 Drawing Sheet

SEMICONDUCTOR SWITCH INCLUDING A DEVICE FOR MEASURING A DEPLETION LAYER TEMPERATURE OF THE SWITCH

TECHNICAL FIELD

The present invention relates to a semiconductor switch with a device for measuring the depletion-layer temperature of a semiconductor rectifier conducting a load current.

TECHNICAL BACKGROUND

The invention is based on the temperature-measuring prior art, by which the depletion-layer temperature of a semiconductor rectifier device is determined directly with a temperature sensor applied to the semiconductor rectifier. However, by this method, the prevailing depletion-layer temperature can be determined only with a considerable time delay because of the distance between the depletion layer and the point of measurement. Rapid temperature changes caused by steep increases in power dissipation cannot be determined at all.

Semiconductor switches are also known in which the current to be switched, which current flows through a semiconductor rectifier, is measured and, if the current exceeds a permissible maximum value, the rectifier is opened after a predetermined time delay which delay may still be partially affected by the output voltage (see, for instance, the article by M. Raffay "UAF 1780—A Low-loss Monolithic Switch Component" in Applikationsbericht 6, SGS-Thomson Leistungs Ics, December, 1988). In these switches, however, the actual depletion-layer temperature is not measured. Such switches are generally opened too early due to the dimensioning which is necessarily adapted to the most unfavorable case of switching.

DESCRIPTION OF THE INVENTION

The present invention attains the object of creating in simple fashion a semiconductor switch of the aforementioned type which is secured against short circuits and overload and with which capacitively acting loads can also be easily controlled.

The semiconductor switch of the invention is characterized by the fact that, due to the measurement of the power converted in the semiconductor rectifier and to the electric simulating of the thermal behavior of the semiconductor rectifier in an electric network connected to the power measurement, the actual temperature of the depletion layer of the semiconductor rectifier can be determined practically without delay and with a desired precision. In particular, gross increases in temperature caused by overcurrents and short circuit currents can be rapidly detected and signaled. In this connection, the invention makes use of the finding that a power measurement on the semiconductor rectifier provides a suitable input variable for an electric model which simulates the thermal behavior of the semiconductor system and in which an electric output variable which is proportional to the depletion-layer temperature to be determined can be obtained extremely rapidly and with the desired precision from the input variable.

The semiconductor switch of the invention consists of comparatively few components, all of which can easily be obtained commercially. It can, therefore, be produced at extremely low cost and is nevertheless well protected against short circuits and overloads. Furthermore, it can be operated easily even with capacitively acting loads.

BRIEF DESCRIPTION OF THE DRAWINGS

The invention will be described in further detail below on basis of an embodiment described in the drawings, which

DETAILED DESCRIPTION

Figure 1:
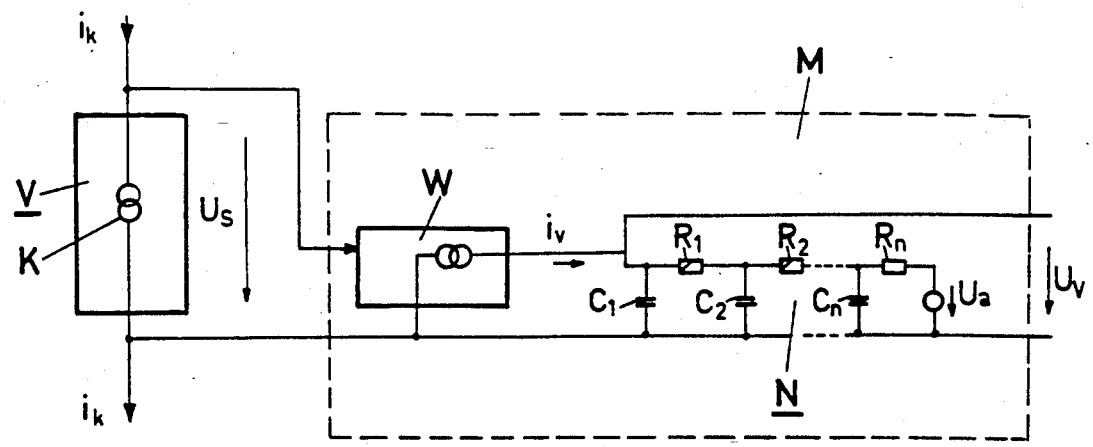
FIG. 1 is a circuit diagram of a device for measuring the depletion-layer temperature of a semiconductor rectifier conducting a load current.

In the circuit shown in FIG. 1, V is a semiconductor rectifier which is traversed by a load current, for instance a transistor. In the event of a short circuit or of an overload in the load circuit, this semiconductor rectifier V acts as source of constant current K which conducts constant current $i_K$ regardless of the rectifier voltage $U_s$. The power dissipation in the semiconductor rectifier V is then substantially proportional to the rectifier voltage $U_s$. The rectifier voltage $U_s$ is fed to a converter element W, for instance an ohmic resistor, in which it is converted into a current $i_v$, with $i_v = 1.U_s$, which is proportional to it and thus directly proportional to the power dissipated, 1 being a proportionality factor. The current $i_v$ is fed to the input of a network N which has a series circuit of RC members $R_1C_1$, $R_2C_2$, ..., $R_nC_n$ with resistances $R_1$, $R_2$, ... $R_n$ and capacitances $C_1$, $C_2$, ..., $C_n$, as well as a reference voltage source of voltage $U_a$.

The network N is such that it electrically simulates the thermal system of the semiconductor rectifier V. The thermal system of the semiconductor rectifier V is determined substantially by the thermal capacitances and the thermal conductivities of its components. This can be simulated electrically to a good approximation by a network having only one RC member, this one RC member having a time constant which corresponds to the time constant of the thermal cooling factor of the semiconductor rectifier V. A better simulation is obtained by a series circuit of two or more RC members and by introducing the reference voltage source the voltage $U_a$ of which is selected so that a voltage corresponding to the ambient temperature $T_A$ is fed into the network ($U_a = k.T_A$, in which k is a proportionality factor).

In this model, the individual resistances $R_i$, $i=1, ..., n$ and capacitances $C_i$, $i=1, ..., n$ are so selected that:

$$R_i(\Omega) = m \cdot R_i^{th}(W/^\circ C.)$$

$$C_i(F) = 1_m C_i^{th}(^\circ C./J)$$

in which $i=1, ..., n$, $R_i^{th}$ being the thermal conductivity between two components of the semiconductor rectifier V, for instance between the depletion layer and the rectifier housing;

$C_i$ being the thermal capacitance of a component of the semiconductor rectifier V, for instance the depletion layer; and m being a model factor.

In this electrical network there is now formed from the power-proportional current input signal $i_v$ an output voltage $U_v$ which is proportional by the proportionality factor k to the actual depletion-layer temperature $T_j$ ($U_v = k \cdot T_j$). In this connection, the factor k is determined from the known values of the constant rectifier current $i_k$, the proportionality factor 1 and the model factor m as $$k = (1 \cdot m)/i_k.$$

One particular advantage of the above-described method and apparatus for the carrying out of this method is that the depletion-layer temperature can be determined practically without delay and with high precision in the event of overload currents or short-circuit currents, and that, in this case, the power measurement is reduced substantially to a voltage measurement by utilization of the property of acting as source of constant current in the case of overcurrent or short circuit which is generally present in semiconductor rectifiers or else established for them. In principle, however, it is also possible, upon the determination of the depletion-layer temperature $T_j$ to measure both the current flowing through the semiconductor rectifier V and the voltage which drops over it and feed the network N with a signal determined therefrom which is proportional to the power dissipated in the semiconductor rectifier V.

Figure 2:
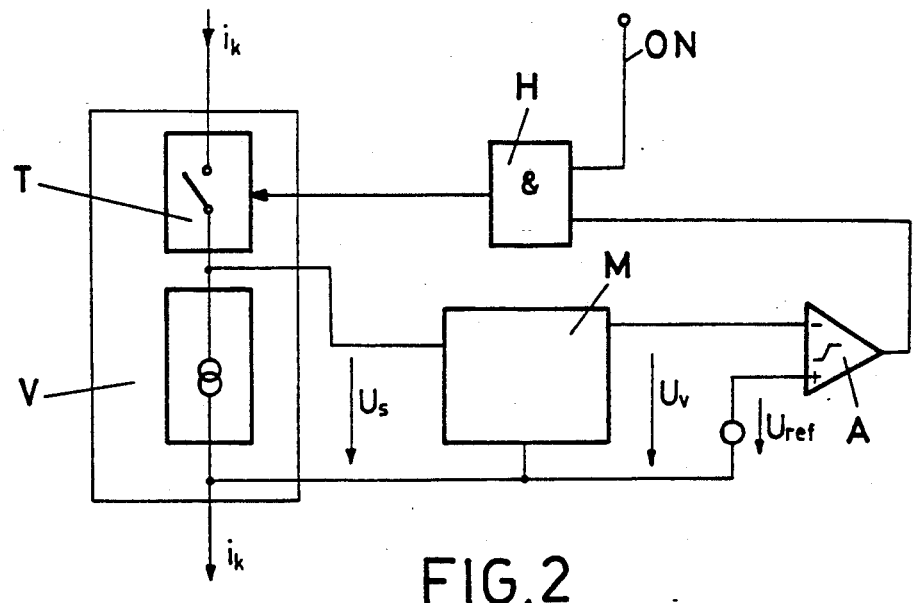
FIG. 2 is a block diagram of a semiconductor switch in accordance with the invention.

FIG. 2 shows, in a block diagram, how the above-described device U, shown as block M, is used to carry out the temperature-measuring method of the invention in order to protect a semiconductor rectifier V configured as a semiconductor switch against damage by excessive heating in the event of an overload or a short circuit. Similar to the device in accordance with FIG. 1, the rectifier voltage $U_s$ established across the semiconductor rectifier V upon its operation as source of constant current k is fed to the temperature-measurement device M, converted in that device in accordance with FIG. 1, in the converter element W, into a power-proportional current, and is then fed to the network N in order to form the depletion-layer temperature-proportional output voltage $U_v$. The output voltage $U_v$ is fed to a first input of a limit-value comparator A. At the second input of the limit-value comparator A there is a voltage $U_{ref}$ produced in a reference voltage source. This voltage is just large enough that the depletion-layer temperature of the semiconductor rectifier V which corresponds to it is still permissible. If the output voltage $U_v$ exceeds the voltage $U_{ref}$, then the permissible depletion-layer temperature in the semiconductor rectifier V is exceeded, in which case the limit-value comparator, via an AND gate H linked with a control signal ON, produces a disconnect signal to a switch T of the semiconductor rectifier V.

Figure 3:
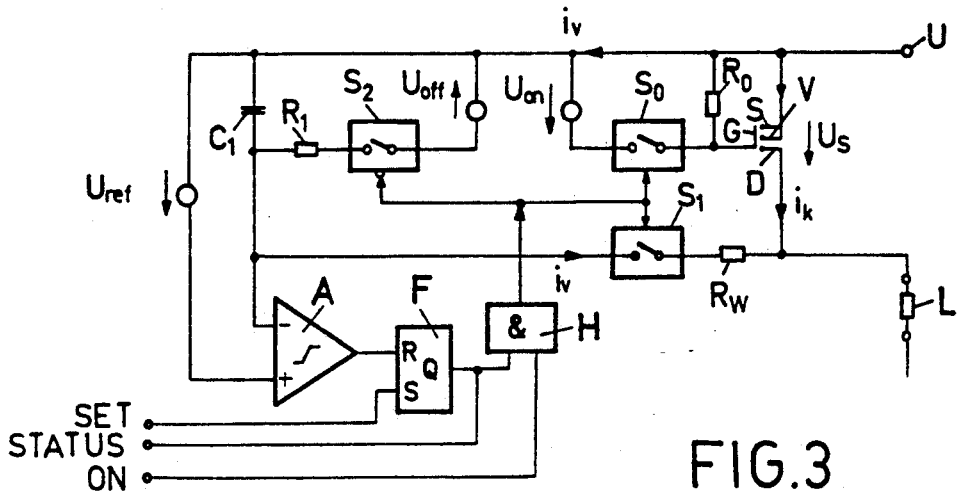
FIG. 3 is a block diagram showing details of the semiconductor switch of FIG. 2.

FIG. 3 is a circuit diagram of a practical embodiment of the semiconductor switch of FIG. 2. In this case there is used as semiconductor rectifier V a field effect transistor whose source electrode S is connected to a feed voltage source U, its drain electrode D to a load L, and its gate electrode G, on the one side via a switch $S_0$ comprising, for instance, as transistor, to a voltage source of the voltage $U_{on}$ and, on the other side, via a resistor $R_0$, to the feed voltage source U. Parallel to the semiconductor rectifier V there is a series circuit of the converter element W comprised as ohmic resistor $R_W$, a switch $S_1$ developed, for instance, a transistor, and the capacitance $C_1$ of the network N of the temperature-measuring device M. Parallel to the capacitance $C_1$ there is a series circuit of the resistance $R_1$ of the network N of the temperature-measuring device, a switch $S_2$, configured, for instance, as a transistor, and a voltage source of the voltage $U_{off}$.

In the case of this semiconductor switch, the switches $S_0$ and $S_1$ are open in the "switch open" state while the switch $S_2$ of inverted control is closed. The semiconductor rectifier V blocks in this phase. The source-gate voltage is zero. Capacitor $C_1$ is discharged on the voltage $U_{off}$ over the resistor $R_1$ with a time constant $T = R_1 \cdot C_1$, which is selected corresponding to the cooling constant of the semiconductor rectifier V. In this connection, the cooling of the depletion layer of the semiconductor rectifier V which takes place because of the open semiconductor rectifier V is electrically simulated.

In the "switch closed" position, the switches $S_0$ and $S_1$ are closed while the switch $S_2$ of inverted control is, on the other hand, opened. The semiconductor rectifier V is acted on by the voltage $U_{on}$, as a result of which it acts, in the case of low load currents, as an ohmic resistor with known minimum and maximum values but in the case of high currents as source of current with known maximum current. This manner of operation is particularly pronounced in the case of a semiconductor rectifier V developed as a MOSFET since, in that case, the characteristic curve establishing the course of the drain current as a function of the voltage drop over the semiconductor rectifier first rises linearly and then extends with a sharp bend parallel to the abscissa on which the voltage is plotted.

In case of overload or short circuit, the depletion-layer temperature $T_j$ is measured in the "switch closed" condition in accordance with the method of the invention. In this case, the semiconductor rectifier V functions as a source of constant current and the resistor $R_W$ which acts as the converter element converts the voltage $U_S$ which drops over the semiconductor rectifier into the current $i_V$ which is proportional to the power converted in the rectifier. In this connection, in the case of high power dissipation peaks, $i_V$ is approximately directly proportional to the power produced in the rectifier V since the voltage over the capacitance $C_1$ which is charged upon the flow of the current $i_V$ and in this connection electrically simulates the thermal behavior of the rectifier can be neglected as compared with the voltage $U_S$ dropping over the rectifier in the case of high power dissipation.

As soon as the capacitance $C_1$ is charged from the voltage $U_{off}$ to a voltage which exceeds the voltage $U_{ref}$ of the reference source, a flip-flop F is reset via the limit-value comparator A which is now activated and a disconnect signal is sent out over the AND gate H to the control electrodes of the switches $S_0$, $S_1$ and $S_2$, as a result of which the switch $S_2$ is closed and the switches $S_0$ and $S_1$ are opened. As a result of this, the semiconductor rectifier V now blocks and is protected against further heating.

By means of a signal input SET, the flip-flop can be again set and attempts at reconnection can be started, while by means of a signal output STATUS an overload current and short circuit can be indicated.

With sufficiently small currents, the rectifier V acts as an ohmic resistor during the course of the "switch closed" condition, and the maximum obtainable depletion-layer temperature is determined in this thermally quasi-steady state by the voltage $U_{ref}$. Rapid increases in power dissipation can be reacted to extremely rapidly since the capacitor $C_1$ is substantially recharged.

I claim:

1. A semiconductor switch including a device for measuring a depletion-layer temperature of a semiconductor switch (V) which conducts load current through load current conductors including at least first and second load current conductors, the device comprising:

a network (N) having an output and at least one RC member which electrically simulates thermal characteristics of the semiconductor switch (V), a converter (W) provided between the first load current conductor of the semiconductor switch (V) and the network (N) for producing a current ($i_V$) which is proportional to a power dissipation in the semiconductor switch (V) and a comparator (A) having a first input which is connected to the output of the network (N), a second input to which a signal which is proportional to a permissible depletion-layer temperature is supplied and having an output, the semiconductor switch (V) having an electrode (G) which controls the load current in the semiconductor switch (V), the converter element (W) being constructed as an ohmic resistor ($R_W$), a first series circuit including the converter element (W), a first switch element ($S_1$), and a capacitor ($C_1$) of the network (N) connected parallel to the first and second load current conductors; a second series circuit including an ohmic resistor ($R_1$) of the network (N), a second switch element ($S_2$) and a first voltage source ($U_{off}$) connected parallel to the capacitor ($C_1$); the electrode (G) which controls the load current being connected via a third switch element ($S_0$) to a second voltage source ($U_{on}$); the comparator output being coupled to act on said first switch element ($S_1$), said second switch element ($S_2$), and said third switch element ($S_0$).

2. A semiconductor switch according to claim 1, characterized in that the semiconductor switch (V) is a field-effect transistor.

3. A semiconductor switch according to claim 1, characterized in that the network comprises a plurality of series connected RC members.

* * * * *